(12) United States Patent
Sakellariou et al.

(10) Patent No.: US 9,128,167 B2
(45) Date of Patent: Sep. 8, 2015

(54) CYLINDRICAL PERMANENT MAGNET DEVICE GENERATING A CONTROLLED MAGNETIC FIELD AT A DISTANCE FROM THE SURFACE THEREOF

(75) Inventors: Dimitrios Sakellariou, Boulogne Billancourt (FR); Guy Aubert, Poitiers (FR); Cédric Hugon, Abingdon (GB)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 713 days.

(21) Appl. No.: 13/063,864
(22) PCT Filed: Aug. 27, 2010
(86) PCT No.: PCT/FR2010/051782
§ 371 (c)(1), (2), (4) Date: Nov. 22, 2011
(87) PCT Pub. No.: WO2011/023911
PCT Pub. Date: Mar. 3, 2011

(65) Prior Publication Data
US 2012/0098539 A1 Apr. 26, 2012

(30) Foreign Application Priority Data
Aug. 28, 2009 (FR) ..................... 09 55890

(51) Int. Cl.
*H01F 7/02* (2006.01)
*G01R 33/383* (2006.01)
(Continued)

(52) U.S. Cl.
CPC ............ *G01R 33/383* (2013.01); *G01R 33/307* (2013.01); *G01R 33/3808* (2013.01); *G01R 33/30* (2013.01); *H01F 7/0278* (2013.01)

(58) Field of Classification Search
CPC .... H01F 7/02; H01F 7/0284; H01F 2038/127
USPC ......................................................... 335/306
See application file for complete search history.

(56) References Cited

U.S. PATENT DOCUMENTS 4,498,048 A * 2/1985 Lee et al. ....................... 324/309
4,538,130 A * 8/1985 Gluckstern et al. ........... 335/306
(Continued)

FOREIGN PATENT DOCUMENTS

WO WO 99/05531 2/1999
WO WO 99/15914 4/1999

*Primary Examiner* — Shawki S Ismail
*Assistant Examiner* — Lisa Homza
(74) *Attorney, Agent, or Firm* — Preti Flaherty Beliveau & Pachios LLP

(57) ABSTRACT

The cylindrical permanent magnet device includes at least one basic structure (10) having a longitudinal axis (z) and a set (20) of coaxial magnetized structures (21, 22, 23, 24) that are in the form of non-contiguous rings of axis that is the longitudinal axis (z) and that are disposed on the same side of the basic structure (10), defining an exterior surface perpendicular to the longitudinal axis (z) to produce a magnetic field ($B_0$) outside the magnet device in an exterior area of interest (3) situated at a predetermined distance from the exterior surface along the longitudinal axis (z). At least one of the coaxial magnetized structures (21, 22, 23, 24) in the form of rings is divided into components in the form of non-contiguous identical sectors. The basic structure (10) and the set (20) of coaxial magnetized structures (21, 22, 23, 24) in the form of rings are magnetized in the same direction (M) to create in the exterior area of interest (3) an induced magnetic field ($B_0$) that is homogeneous or that has a constant gradient and that is oriented at a predetermined angle ($\theta_2$) relative to the longitudinal axis (z).

23 Claims, 5 Drawing Sheets

(51) Int. Cl.
*G01R 33/38* (2006.01)
*G01R 33/30* (2006.01)

(56) References Cited

U.S. PATENT DOCUMENTS

| | | | |
|---|---|---|---|
| 4,580,098 A * | 4/1986 | Gluckstern et al. | 324/307 |
| 4,703,276 A * | 10/1987 | Beer | 324/319 |
| 4,727,327 A * | 2/1988 | Toyoshima et al. | 324/309 |
| 4,829,277 A * | 5/1989 | Stahura et al. | 335/306 |
| 4,931,760 A * | 6/1990 | Yamaguchi et al. | 335/306 |
| 5,134,374 A * | 7/1992 | Breneman et al. | 324/319 |
| 5,148,138 A * | 9/1992 | Miyata | 335/302 |
| 5,332,971 A | 7/1994 | Aubert | |
| 6,147,578 A | 11/2000 | Panfil et al. | |
| 6,411,187 B1 * | 6/2002 | Rotem et al. | 335/296 |
| 6,489,872 B1 * | 12/2002 | Fukushima et al. | 335/299 |
| 6,828,892 B1 * | 12/2004 | Fukushima et al. | 335/299 |
| 7,760,059 B2 * | 7/2010 | Higuchi | 335/306 |

\* cited by examiner ized structures that are in the form of non-contiguous rings of axis that is said longitudinal axis and that are disposed on the same side of the basic structure, defining an exterior surface perpendicular to said longitudinal axis to produce a magnetic field outside the magnet device in an exterior area of interest situated at a predetermined distance from said active surface along the longitudinal axis.

CYLINDRICAL PERMANENT MAGNET DEVICE GENERATING A CONTROLLED MAGNETIC FIELD AT A DISTANCE FROM THE SURFACE THEREOF

FIELD OF THE INVENTION

The present invention relates to a cylindrical permanent magnet device applied to a nuclear magnetic resonance device and including at least one base structure having a longitudinal axis and a set of coaxial magnetized structures that are in the form of non-contiguous rings of axis that is said longitudinal axis and that are disposed on the same side of the basic structure, defining an exterior surface perpendicular to said longitudinal axis to produce a magnetic field outside the magnet device in an exterior area of interest situated at a predetermined distance from said active surface along the longitudinal axis.

PRIOR ART

In the field of nuclear magnetic resonance (NMR), the sample (object or patient) is placed inside a static magnetic field that must be very intense and very homogeneous. It is therefore necessary to be able to manufacture magnetized structures capable of producing such magnetic fields.

Moreover, it is often useful to be able to produce a magnetic field in a predetermined direction. For example, in order to improve resolution, in the magic angle spinning (MAS) technique a sample is made to spin rapidly at a so-called magic angle (equal to 54 degrees 44 minutes) to the direction of the static magnetic field.

The spectral resolution of an NMR signal depends greatly on the magnitude of the static magnetic field, which must be as high as possible, and its homogeneity. Moreover, the intensity of the signal is also strongly dependent on the intensity of the magnetic field and increases with it. Thus to obtain high magnetic fields and the required homogeneity, NMR spectrometers use costly devices to create this kind of strong and homogeneous static magnetic field.

The magnets used at present in NMR and MRI (magnetic resonance imaging) may be classified into four categories:

a) Superconductor magnets capable of producing a very strong field (up to 20 teslas (T) to 25 T in continuous mode) that is also very homogeneous. Those magnets include windings of superconductive material that are costly to manufacture and costly to operate because of the necessity to use a cryogenic environment. Such magnets are generally bulky and heavy and difficult to transport. Moreover, most of those magnets correspond to a closed configuration, i.e. the sample to be treated in the magnetic field created must be placed inside a tunnel inside the magnet.

b) Resistive electromagnets based on standard conducting windings and mostly used before the advent of superconductor magnets. Such electromagnets are less costly than superconductor magnets but they require a great deal of power to energize them and they dissipate a great deal of energy. In particular, they usually need to be water-cooled. Moreover, the fields created are limited to approximately 3 T.

c) Permanent magnets based on hard magnetic materials. Their remanence is limited to approximately 1.4 T and their use calls for precautions to prevent demagnetization. Thus there are as yet few truly operational permanent magnet systems used in NMR, especially systems achieving the homogeneity required to perform spectroscopy.

d) Hybrid magnets using a combination of resistive electromagnets and permanent magnets. They improve on compactness and reduce the current necessary in the windings.

The magnets used at present in NMR to create intense and homogeneous fields are for the most part based on the flow of current in windings. Whether the windings are resistive or superconducting, it is always necessary to supply the magnet with current and also with cryogenic fluids for superconducting windings. Because of this, the devices are bulky and difficult to move. Resistive windings require high-current feeds, while superconducting windings imply the use of a cryostat filled with cryogenic liquids, which is difficult to move.

In the past, very few structures based on permanent magnets have been proposed for generating a homogeneous longitudinal field at the center. This is because the NMR applications that require high homogeneity also require the devices to be either very large (in MRI where a human body must be placed inside the device), which implies an enormous quantity of material (several tons), or very intense (in NMR spectroscopy, which uses fields exceeding 10 T, at present up to 20 T to 25 T), which is simply not feasible at present with permanent materials.

Ex situ NMR systems allow NMR measurement of the magnetic field to be effected outside the structure that creates the static magnetic field. This is particularly useful for subjects that cannot be inserted into the tunnel of a standard NMR magnet. It is desirable for these systems to be able to use permanent magnets in order to be transportable and used in diverse applications outside a laboratory.

As already indicated, the main problem of ex situ NMR is the difficulty of obtaining high homogeneity in a region of interest at the same time as achieving a high intensity in the same region of interest.

Ex situ NMR has already been used with relatively rudimentary means to study porous materials in oil wells during drilling.

U.S. Pat. Nos. 6,489,872 and 6,828,892 describe ex situ NMR concepts based on permanent magnets but do not seem to have led to practical applications.

Patent application WO 99/05531 describes a set of annular permanent magnets that may divided into contiguous segments and that create a relatively homogeneous field in a region situated above the system, but no practical application of such a structure is known at present. Patent applications WO 99/15914 and WO 00/57435 modify that concept to apply it to hybrid symmetrical systems comprising two facing annular structures cooperating with two resistive electromagnets.

In U.S. Pat. No. 5,332,971, Guy Aubert has already proposed a structure offering a strong and homogeneous field at its center, allowing transverse access to the area of interest, and using two complementary sets of rings situated on either side of the area of interest, these rings being divided into contiguous segments. A somewhat similar system is described in U.S. Pat. No. 5,134,374.

Patent application WO 02/056047 describes a number of possibilities for producing magnets creating a lateral field, including one embodiment using a pair of concentric magnets.

U.S. Pat. No. 6,657,433 proposes a structure for creating homogeneity outside the magnet, but that structure is difficult to produce because it is difficult to define in a controlled manner the orientation of the magnetization in parts of the permanent magnet.

A one-sided portable ex situ NMR system is proposed in patent application WO 00/79253 and U.S. Pat. No. 6,489,767, but the proposed system is not very homogeneous and the field obtained remains relatively weak, with the result that such a system cannot be used for spectral resolution.

DEFINITION AND OBJECT OF THE INVENTION

The present invention aims to solve the problems referred to above and in particular to offer a solution to the problem of assembling magnetized parts to form powerful permanent magnets capable of creating a controlled and intense magnetic field at a predetermined distance outside the magnetized structure, the induced field having a predetermined orientation relative to the longitudinal axis of the structure.

The invention aims in particular to allow the production of transportable devices allowing use outside a specialist laboratory.

The invention may find applications inter alia in the fields of "light" NMR or MRI.

Generally speaking, the present invention aims to provide a magnetized structure inducing a controlled magnetic field at a distance from its surface.

These aims are achieved in accordance with the invention by a cylindrical permanent magnet device applied to a nuclear magnetic resonance device and including at least one basic structure having a longitudinal axis and a set of coaxial magnetized structures that are in the form of non-contiguous rings of axis that is said longitudinal axis and that are disposed on the same side of the basic structure, defining an exterior surface perpendicular to said longitudinal axis to produce a magnetic field outside the magnet device in an exterior area of interest situated at a predetermined distance from said exterior surface along the longitudinal axis, the permanent magnet device being characterized in that at least one of the coaxial magnetized structures in the form of rings is divided into components in the form of non-contiguous identical sectors, and the basic structure and the set of coaxial magnetized structures in the form of rings are magnetized in the same direction to create in said exterior area of interest an induced magnetic field that is homogeneous or that has a constant gradient and that is oriented at a predetermined angle relative to said longitudinal axis.

In one preferred embodiment, said predetermined angle is zero and all the components in the form of sectors are magnetized along said longitudinal axis.

The basic structure may be cylindrical with a circular section, but may equally be prism-shaped.

The basic structure may be divided into contiguous identical sectors.

In one preferred embodiment, the set of coaxial magnetized structures comprises a central first structure, an intermediate structure divided into regularly distributed non-contiguous identical sectors, and an exterior structure divided into regularly distributed non-contiguous identical sectors.

By way of non-limiting example, each of the coaxial magnetized structures divided into non-contiguous sectors comprises twelve sectors, but could equally comprise a smaller number of sectors, for example ten or fewer, which produces acceptable results, or more than twelve if it is required to increase homogeneity further.

The coaxial magnetized structures divided into non-contiguous sectors may have different thicknesses in the direction of the longitudinal axis.

Similarly, the coaxial magnetized structures divided into non-contiguous sectors may be positioned at different levels along the longitudinal axis.

The central first structure may constitute a one-piece central block that is cylindrical with a circular section or a polygonal section.

The central first structure may equally be produced in the form of a ring divided into regularly distributed non-contiguous identical sectors.

The non-contiguous sectors of the annular magnetized structures may have a trapezoidal shape.

The device of the invention may be adapted in order to create a constant gradient magnetic field or a homogeneous magnetic field.

On the side of the active exterior surface, the basic structure may have a recessed central part in which there is disposed at least one coaxial magnetized structure in the form of a ring divided into components in the form of non-contiguous sectors to create in said exterior area of interest a homogeneous induced magnetic field.

The basic structure and the set of coaxial magnetized structures may in particular be produced in NdFeB or SmCo.

The device of the invention applied to a nuclear magnetic resonance device offers in particular the possibility of providing spectral and/or spatial resolution, and of measuring relaxation time.

BRIEF DESCRIPTION OF THE DRAWINGS

Other features and advantages of the invention emerge from the following description of particular embodiments given by way of example with reference to the appended drawings, in which.

DETAILED DESCRIPTION OF PREFERRED EMBODIMENTS

Generally speaking, the present invention relates to a method of assembling magnetized parts in an essentially axisymmetrical or quasi-axisymmetrical manner to create a magnetic field that is arbitrarily homogeneous in an area of interest at a predetermined distance from the structure consisting of the assembly of magnets. The profile of the induced magnetic field may be chosen arbitrarily, in particular it may be a constant profile or a constant gradient profile. The position of the area of interest along the axis of symmetry of the system may also be chosen arbitrarily. The field obtained may be rendered arbitrarily homogeneous by choosing the number and the dimensions of the components in accordance with general rules discussed below. A structure of this kind is of particular benefit for NMR and MRI.

Figure 1A:
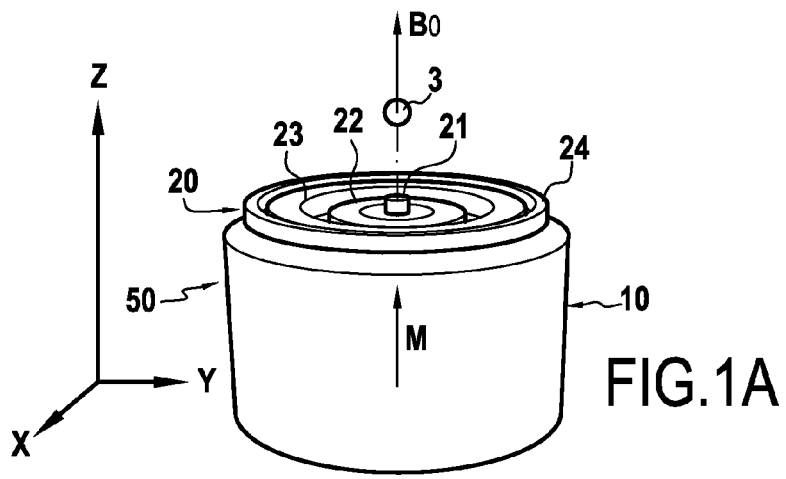
FIGS. 1A and 1B are diagrammatic overall perspective views of a cylindrical permanent magnet device of the invention with two different orientations of the magnetic field it creates.
Figure 1B:
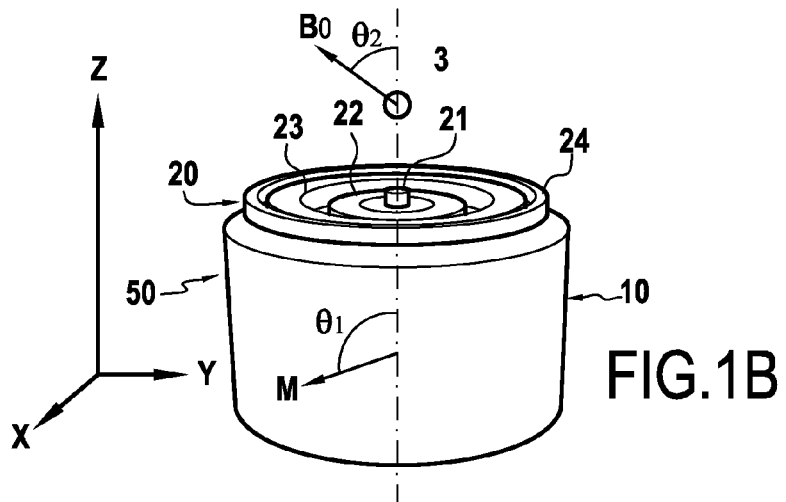

FIGS. 1A and 1B show an axisymmetrical magnetized structure 50 of axis z that includes a magnetic material support 10 on which there is disposed a set 20 of coaxial rings 21, 22, 23, 24 of magnetic material that are aligned with the same longitudinal axis z. All the magnetic parts are magnetized in the same direction (see the magnetization vector M in FIGS. 1A and 1B), which direction may be the direction of the longitudinal axis z of the structure (FIG. 1A) or a direction at a non-zero angle $\theta_1$ to that axis z (FIG. 1B). The center of the region of interest 3 at which a field $B_0$ of chosen homogeneity is to be created is situated on the axis z at a given distance from the upper surface of the structure 50. FIG. 1A shows the vector of the magnetic field $B_0$ oriented along the axis z and FIG. 1B shows the vector of the magnetic field $B_0$ at a non-zero angle $\theta_2$ to the axis z.

The rings 21 to 24 may have the same or different thicknesses and may be situated at the same level or at different levels relative to the upper surface of the support 10. The dimensions and the relative positions of the rings are calculated to define the required homogeneity. These calculations are based on an analytical method that aims to eliminate terms of the expansion into spherical harmonics of the field at the center of the region of interest 3. Rotational symmetry makes it possible to eliminate the non-axial terms of the expansion, while the combination of the rings 21 to 24 and the support 10 makes it possible to eliminate the required axial terms of the expansion.

Note also that if the structure is turned after assembly, the residual inhomogeneities are partly compensated by an averaging effect and it is possible to improve the static homogeneity by an order of magnitude.

According to the invention, at least one of the coaxial magnetized structures 21 to 24 in the form of non-contiguous rings is divided into components in the form of non-contiguous sectors.

Figure 3:
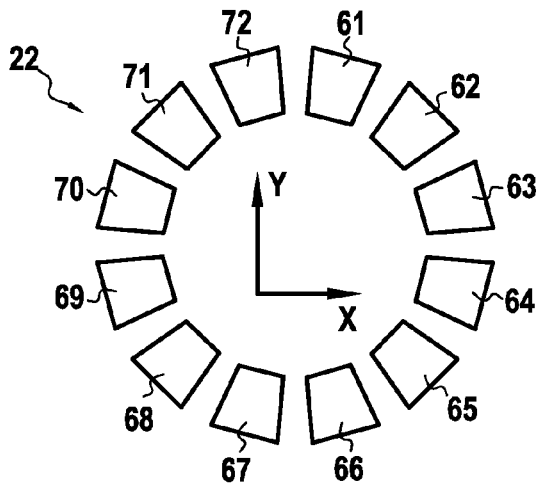
FIG. 3 is a top view showing one possible form of a structure comprising non-contiguous components of an intermediate magnetized structure usable in a device of the invention.

For example, with a set of three coaxial rings 21 to 23, the median ring 22 may be divided into components in the form of non-contiguous sectors 61 to 72, as shown in FIG. 3. The invention is not limited to a number of sectors equal to 12, however, and this number could be different from 12, for example equal to 10 or 11, or greater than 12 if it is required to increase the homogeneity.

Figure 4:
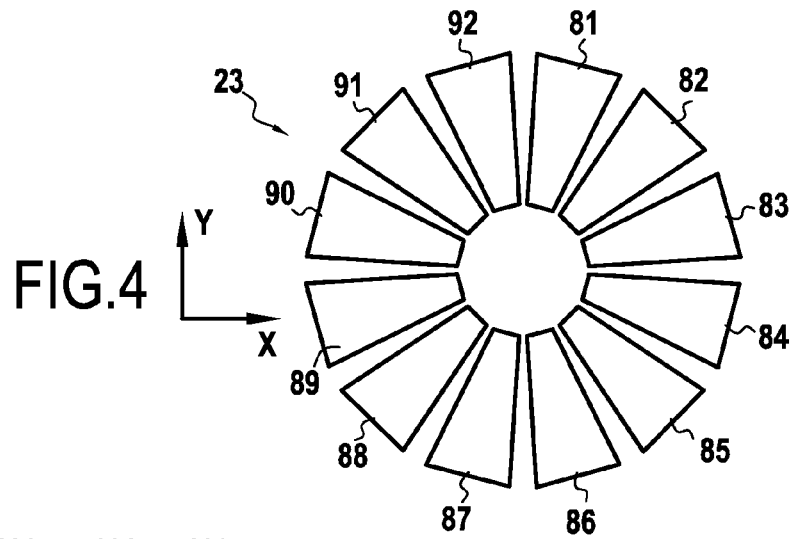
FIG. 4 is a top view showing one possible form of a structure comprising non-contiguous components of an exterior magnetized structure usable in a device of the invention.

Similarly, FIG. 4 shows an exterior ring 23 divided into components in the form of non-contiguous sectors 81 to 92, the number of which is preferably greater than or equal to 10, for example equal to 12 as shown in FIG. 4.

Figure 2:
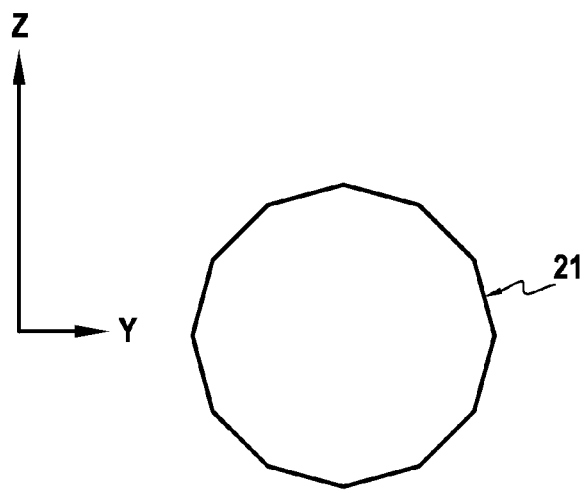
FIG. 2 is a top view showing one possible form of a polygonal structure of a central magnetized structure usable in a device of the invention.

In this example, the central ring 21 consists of a single block, which may be cylindrical or prism-shaped as shown in FIG. 2.

Generally speaking, it is advantageous to produce each annular cylindrical structure in the form of a regular polyhedral structure comprising a set of N identical segments. Thus each segment is a right-angle prism of isosceles trapezoidal section and its magnetization is parallel to the height of the prism or at a predetermined angle to that height.

Each sector-shaped elementary segment may optionally be contiguous with the adjacent segments. However, according to the present invention, in order to provide the possibility of adjustment after assembly, at least one ring 22 or 23 is produced with non-contiguous segments in the same ring, as shown in FIGS. 3 and 4.

A few basic concepts useful for understanding the invention are briefly described below.

Usually, the region of interest (RoI) is outside the region of the sources of magnetic field and a pseudo-scalar magnetic potential may be defined such that:

$$\vec{B} = -\vec{\nabla}\Phi^*$$

This potential satisfies the Laplace equation:

$$\Delta\Phi^* = 0$$

In the situation of interest here, the region of interest may be represented as a sphere of center that is referred to as the origin. The Laplace equation may be expressed in a system of spherical coordinates and a unique expansion of the potential into spherical harmonics may be obtained, centered at the origin. The general solution for the potential may then be written:

$$\Phi^*(r, \theta, \phi) = \sum_{l=0}^{\infty}\sum_{m=-l}^{l}[A_{lm}r^l + B_{lm}r^{-(l+1)}]Y_{lm}(\theta, \phi),$$

where:

$$Y_{lm}(\theta, \phi) = \sqrt{\frac{2l+1}{4\pi}\frac{(l-m)!}{(l+m)!}}\, P_l^m(\cos\theta)\exp(im\phi)$$

Remembering that the potential exists only in empty space, space may be divided into two areas in which the potential exists: inside the largest sphere centered at the origin that does not contain any source and outside the smallest sphere centered at the origin that contains all the sources.

If the sources are situated outside this sphere, the expansion may be written as follows:

$$\Phi^*(r, \theta, \phi) = \frac{1}{\mu_0}\left\{Z_0 + \sum_{n=1}^{\infty}r^n\left[Z_nP_n(\cos\theta) + \sum_{m=1}^{n}(X_n^m\cos(m\phi) + Y_n^m\sin(m\phi))P_n^m(\cos\theta)\right]\right\}$$

where the terms $Z_n$ are called the axial terms and the terms $X_n^m$ and $Y_n^m$ are called the non-axial terms.

On the basis of the above equation, it may be concluded that in order to obtain a homogeneous field it is necessary to find a distribution of the source that creates a potential for which the expansion contains only the term $Z_1$ (provided the field is the derivative of the potential and that the term $Z_0$ for the field corresponds to the term $Z_1$ for the potential). Strictly speaking, this is impossible, but as many terms as necessary may be eliminated to obtain the required homogeneity with a given radius r since the field varies with $$\left(\frac{r}{a}\right)^n$$

where a is a constant characteristic of the geometry. In conclusion, to obtain the required homogeneity, it is necessary to eliminate the first k orders until $$\left(\frac{r}{a}\right)^{k+1}$$

is sufficiently small.

It may also be deduced from the above equation that an axisymmetrical structure is advantageous in that it eliminates the non-axial terms. To obtain homogeneity of order n, the n symmetry of rotation guarantees that no non-axial term exists before order n.

Once the non-axial terms have been eliminated, the axial terms remain.

It is possible to eliminate arbitrarily the orders p by providing p+1 independent sources.

Non-linear optimization is thus possible. Moreover, the solution found may be expanded. The system may be expanded uniformly in all dimensions (constant scale factor) and made as large as possible, the homogeneity properties being unaffected and the amplitude of the magnetic field remaining constant.

It can be shown that the homogeneity properties of the field generated by a structure calculated as above vary in a manner that is perfectly predictable if the magnetization of all the parts is inclined in a given direction. Starting from a symmetrical structure allowing elimination of the non-axial terms up to order n, the orthogonal component of the magnetization introduced by the inclination generates non-axial terms from order n−2. Moreover, the modulus of the resulting field is decreased and its direction inclined.

There exist situations, notably in NMR, where it may be useful to have a magnetic field at an angle to the axis of symmetry. For example, spiral windings cannot be used easily for an orientation of the field parallel to the geometrical axis of the cylinder. With an inclined field this type of winding becomes usable. The inclination $\theta_2$ of the field to the axis of symmetry may be linked to the inclination $\theta_1$ of the magnetization to the axis of symmetry by the following formulas:

$$\sin\theta^1 = \frac{2\sin\theta_2}{\sqrt{1+3\sin^2\theta_2}}, \quad \cos\theta_1 = -\frac{\cos\theta_2}{\sqrt{1+3\sin^2\theta_2}}$$

$$\sin\theta_2 = \frac{\sin\theta_1}{\sqrt{1+3\cos^2\theta_1}}, \quad \cos\theta_2 = -\frac{2\cos\theta_1}{\sqrt{1+3\cos^2\theta_1}}$$

It is thus a simple matter to determine the inclination of the magnetization to impart the desired inclination to the field. This may prove particularly useful in NMR of anisotropic materials. Inclining the field at the magic angle ($\theta_2 \approx 54.7°$) plus rotating the magnet on its axis would make it possible to improve resolution in the same way as the MAS technique. This is advantageous in that it is no longer necessary to spin the sample and this makes it possible to analyze with a high resolution fragile (for example living) subjects or bulky subjects.

In practice, the magnetic material parts are not perfect and include heterogeneities, and their assembly leads to some heterogeneous demagnetization in the parts. It is therefore necessary to be able to carry out adjustments relative to the theoretically defined configurations, and it is important that the overall structure be designed to facilitate such adjustments. The device of the invention specifically allows such adjustments by means of its non-contiguous concentric rings, at least one of which is divided into non-contiguous sectors.

If the imperfections are considered to correspond to small disturbances relative to the theoretical result and if it is considered that the problem may be linearized in terms of movement of the components, the components of each divided ring may be moved and the effect on each part of small movements evaluated. This makes it possible to deduce the movements required to correct the imperfections. This process may naturally be carried out iteratively until the required performance is obtained.

Figure 7:
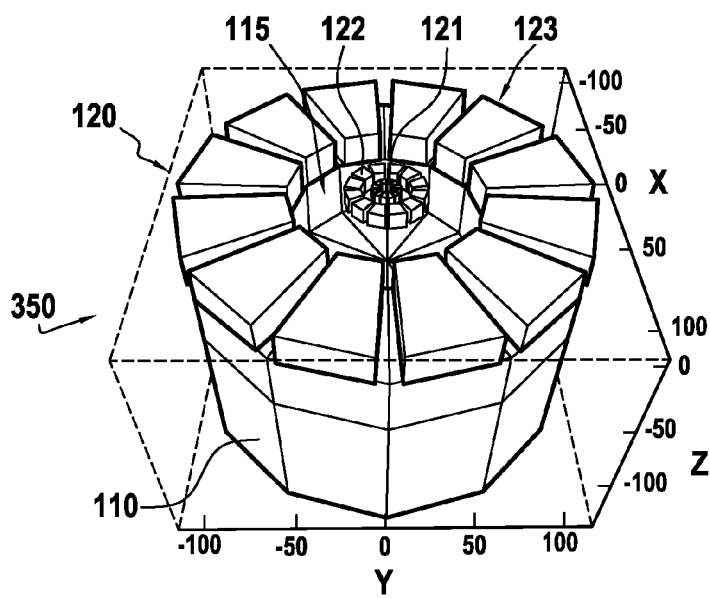
FIG. 7 is a perspective view of a third embodiment of a cylindrical permanent magnet device of the invention that creates a homogeneous field outside the device.
Figure 5:
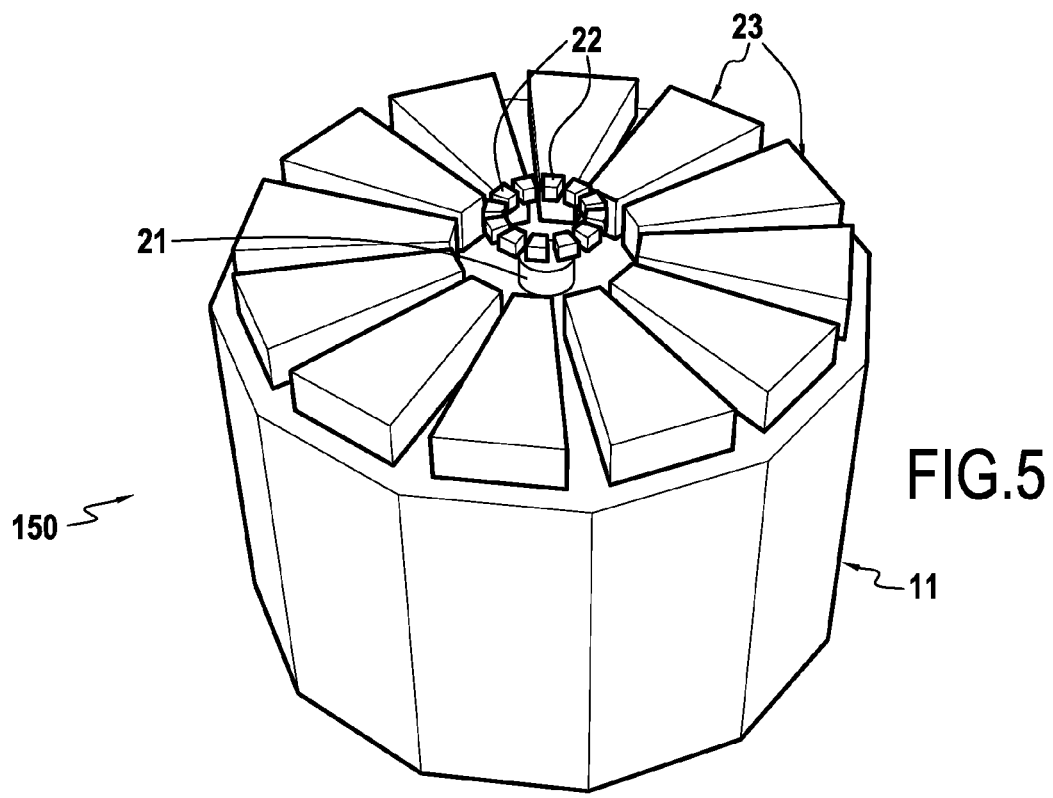
FIG. 5 is a perspective view of a first embodiment of a constant gradient cylindrical permanent magnet device of the invention with a cylindrical basic structure of polygonal section.
Figure 6:
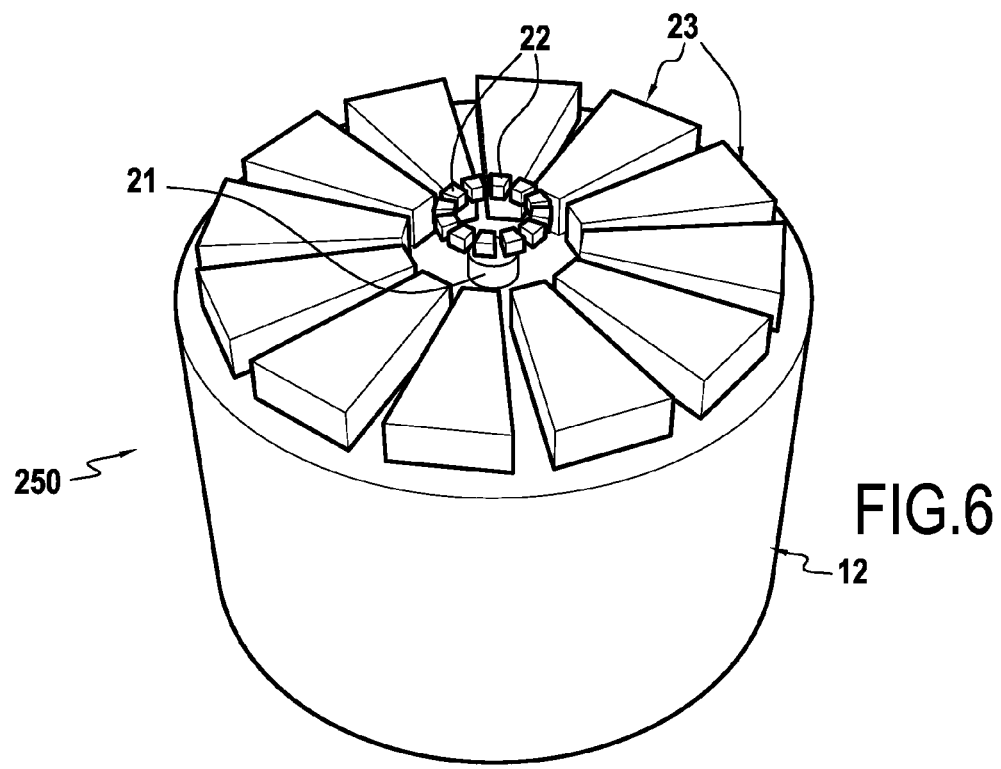
FIG. 6 is a perspective view of a second embodiment of a constant gradient cylindrical permanent magnet device of the invention with a cylindrical basic structure of circular section.

The structures of the embodiments of FIGS. 5 to 7 apply the above teaching.

FIGS. 5 and 6 show two embodiments of a magnet device constituting a system for generating a constant gradient magnetic field.

An optimum area of interest may be situated 2 centimeters (cm) above the upper surface of the magnet device, for example, and may have a constant gradient field in a sphere of 1 cm diameter with a variation of a few ppm (parts per million).

As shown in FIGS. 5 and 6, three concentric rings 21, 22, 23 are disposed above a basic support 11, respectively 12, to constitute the magnet device 150, respectively 250. These parts may have a cylindrical shape of circular section, making them easier to manufacture, or a prism shape that may simplify the calculations. These embodiments may lead to the same performance, but the calculations are slightly different.

In the FIG. 5 embodiment there is an essentially prism-shaped overall structure with a prism-shaped base support 11 and intermediate and external coaxial rings 22, 23 that are also prism-shaped and made up of trapezium-shaped non-contiguous sectors. The one-piece central part 21 may be cylindrical as shown in FIG. 5 or prism-shaped as shown in FIG. 2.

In the FIG. 6 embodiment there is an overall structure 250 similar to the structure 150 in FIG. 5 with a cylindrical base support 12 to facilitate manufacture. Once again, the central ring 21 may be in one piece with no central orifice and may be cylindrical or prism-shaped.

In the examples of FIGS. 5 and 6, the rings 22 and 23 comprise twelve individual sectors, gaps being provided between the sectors of the same ring and between the rings to allow easy and fine adjustments.

The use of twelve sectors in each ring constitutes a preferred embodiment with a satisfactory order of homogeneity. A smaller number of sectors, for example ten sectors or even fewer sectors, also allows useful results to be obtained, but with slightly degraded homogeneity. To improve the homogeneity further, the rings 22, 23 may be divided into more than twelve sectors.

The magnetic parts may be in NdFeB or SmCo, for example, which have high remanence and high coercivity, while their anisotropic field is also very high. The invention is not limited to this type of material, however. All the parts are magnetized in the same direction, generally the direction of the axis z of symmetry of the structure, which simplifies manufacture.

The coaxial rings 21, 22, 23, 24, the number of which is preferably equal to three or four although this is not limiting on the invention, may have the same thickness and may be situated at the same level on the upper transverse face of the basic support 10, 11, 12, or they may have different thicknesses or they may be offset in height along the axis z.

For example, it may be easier to adjust the position of the parts of the intermediate ring 22 if the plane of this ring is raised relative to the adjacent rings, as shown in FIGS. 5 and 6, because this facilitates access to the parts.

The structures described by way of example eliminate the terms of the expansion into $2^{nd}$, $3^{rd}$, $4^{th}$, and $5^{th}$ order spherical harmonics and are therefore dominated by the $6^{th}$ order.

Figure 8:
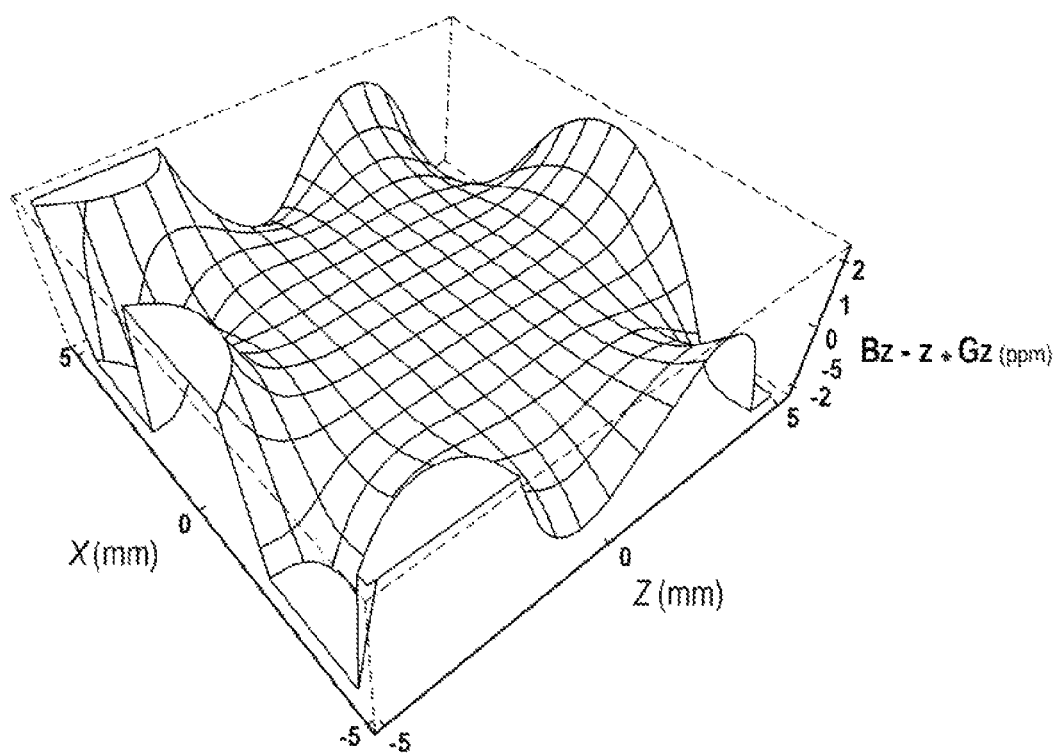
FIG. 8 shows the variations in two directions of the magnetic flux density $B_0$ of the magnetic field less the value of the field produced by its constant gradient in the vicinity of the center of homogeneity created by a device as shown in FIG. 5 or FIG. 6.

FIG. 8 shows for the embodiments described above with reference to FIGS. 5 and 6 the variations in the component $B_z$ of the magnetic field created in the area of interest in the vicinity of the center of homogeneity in a plane xOz containing the axis of symmetry, after elimination of the gradient.

Figure 9:
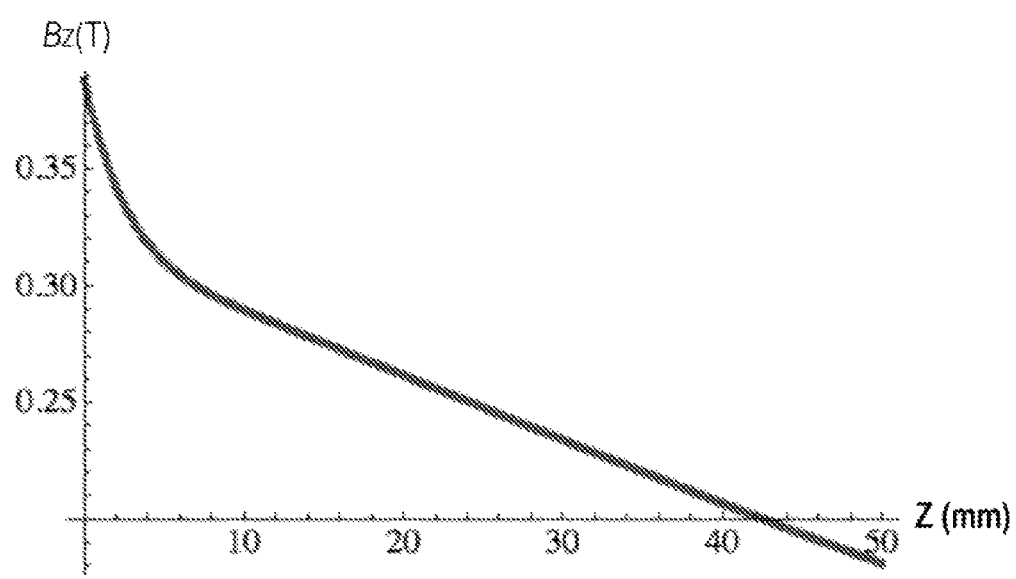
FIG. 9 shows the variation along the axis of symmetry of the device of the magnetic flux density $B_0$ of the magnetic field in the vicinity of the center of homogeneity created by a device as shown in FIG. 5 or FIG. 6.

FIG. 9 shows for the embodiments described above with reference to FIGS. 5 and 6 the variations in the component $B_z$ of the magnetic field created in the area of interest in the vicinity of the center of homogeneity along the axis z of symmetry as a function of the distance from the active upper surface of the magnet device 150 or 250. This curve shows an almost perfect gradient.

Another embodiment of the invention taking the form of a magnet device 350 for generating an extremely homogeneous magnetic field is described below with reference to FIG. 7.

The FIG. 7 device is very similar to the FIGS. 5 and 6 devices, which relate to constant gradient systems.

For example, the device from FIG. 7 may create an area of optimum homogeneity 16 millimeters (mm) above the upper surface of the magnet device 350 with a theoretical homogeneous field varying from only a few ppm in a sphere of 8 mm diameter.

The structure described by way of example comprises a set 120 of three coaxial magnetized structures or rings 121, 122, 123 placed above a basic structure 110 also of magnetic material which, unlike the basic structures 11 and 12 of the embodiments of FIGS. 5 and 6, have on the active upper exterior surface a recessed central part 115 forming a cavity in which is disposed at least one of the concentric magnetized structures in the form of a ring divided into components in the form of non-contiguous sectors.

FIG. 7 shows that the exterior ring 123 is disposed on the upper peripheral face of the basic structure 110 and the intermediate ring 122 and the central ring 121 are both disposed inside the cavity 115 and slightly offset along the axis z relative to the exterior ring 123. The central ring 121, which may itself be divided into non-contiguous sectors, and the intermediate ring 122, also divided into non-contiguous sectors, are immobilized in the cavity 115 by standard mechanical immobilizing members not represented in the drawing.

The embodiments described may be combined with each other. For example, although FIG. 7 shows an entirely prism-shaped structure, the basic support 110, which may optionally be produced from contiguous sectors, could be cylindrical with a circular section as in the FIG. 6 embodiment. One or more rings 121, 122, 123 of the set 120 could also be produced with cylindrical rather than prism-shaped internal and peripheral walls whilst still being divided into non-contiguous sectors for at least one of the rings, gaps remaining between the non-contiguous sectors and also between the rings to allow the necessary adjustments as in the embodiments constituting constant gradient systems.

The nature of the materials used and the orientation of the magnetization of the individual parts may be chosen as indicated above with reference to the embodiments of FIGS. 5 and 6.

The structures shown by way of example eliminate the $2^{nd}$, $3^{rd}$, $4^{th}$, and $5^{th}$ terms of the expansion into spherical harmonics of orders and are thus dominated by the $6^{th}$ order.

Figure 10:
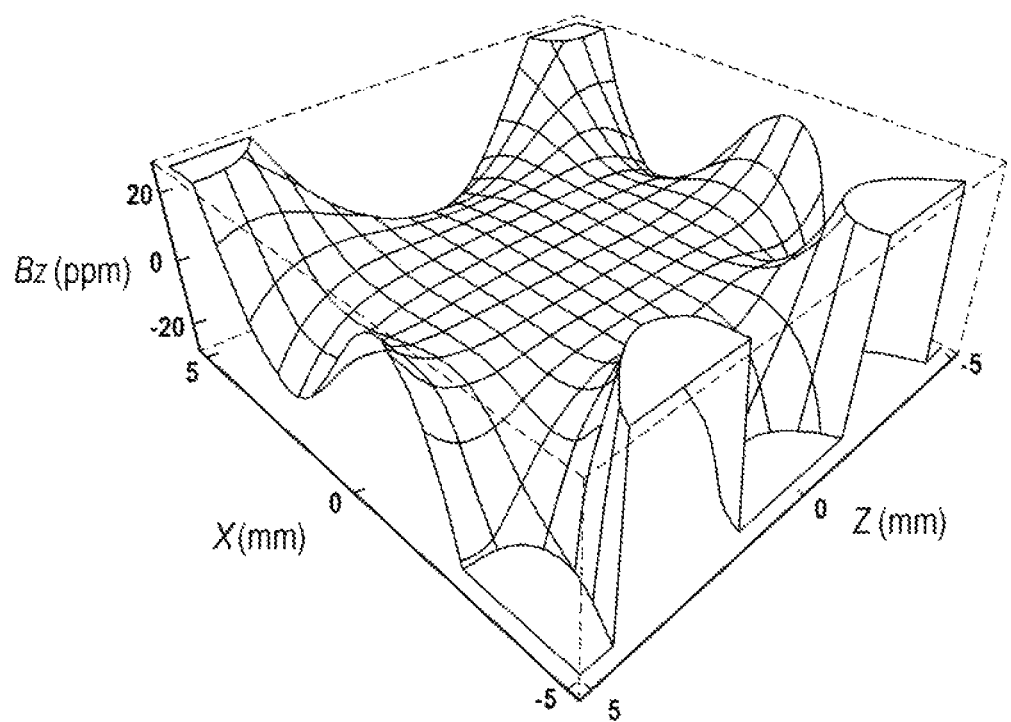
FIG. 10 shows the variations in two directions of the magnetic flux density $B_0$ of the magnetic field in the vicinity of the center of homogeneity created by a device as shown in FIG. 7.

FIG. 10 shows, for the FIG. 7 embodiment described above, the variation of the component $B_z$ of the magnetic field created in the area of interest in the vicinity of the center of homogeneity in a plane xOz containing the axis of symmetry, after elimination of the gradient.

Figure 11:
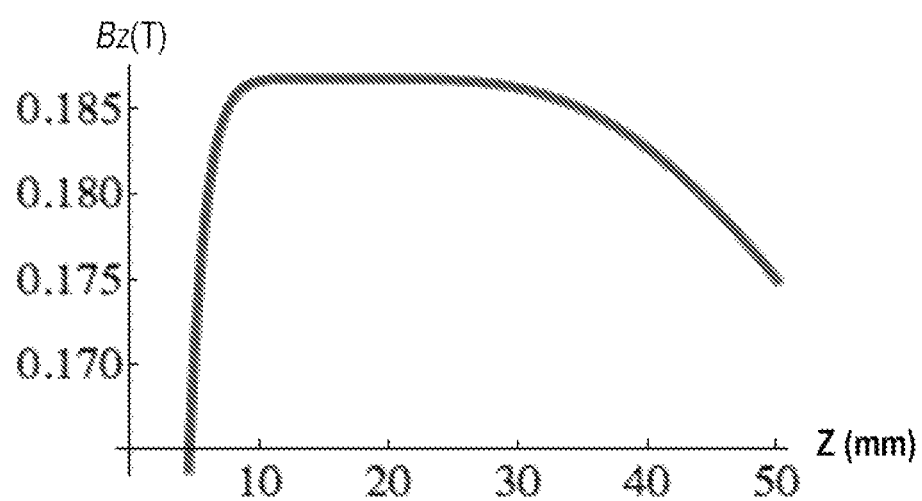
FIG. 11 shows the variation along the axis of symmetry of the device of the magnetic flux density $B_0$ of the magnetic field in the vicinity of the center of homogeneity created by a device as shown in FIG. 7.

FIG. 11 shows, for the FIG. 7 embodiment described above, the variation of the component $B_z$ of the magnetic field created in the area of interest in the vicinity of the center of homogeneity, along the axis z of symmetry, as a function of the distance from the active upper surface of the magnet device 350. Note from this curve that there is an area of constant field and that the value of the magnetic flux density changes very rapidly outside that area.

The design of the device of the invention makes it possible in particular to simulate the effects of demagnetization or random magnetization within each individual part and geometrical imperfections liable to degrade the profile of the magnetic field created.

The effect of a small movement of an individual component, for example a component of trapezoidal shape, may be calculated and a Jacobi matrix constructed. From this matrix it is possible to calculate the movements required to correct the imperfections, provided that the system is not too far removed from the ideal solution and that the system may be considered locally linear. A result can generally be obtained after a few iterations. For example, the calculated or simulated movements are less than around 2 mm and the corrections to be made to the initial configuration remain minimal. The device of the invention thus lends itself very well to simulating and correcting small manufacturing imperfections that are inevitable in practice, which makes it possible most of the time to avoid, but does not rule out, the use, if necessary, of adjustment methods using small additional pieces of ferromagnetic material or of permanently magnetized material.

The invention claimed is:

1. A cylindrical permanent magnet device applied to a nuclear magnetic resonance device and including a single basic structure having a longitudinal axis and a set of coaxial magnetized structures that are in the form of non-contiguous rings of axis that is said longitudinal axis and that are disposed on the same side of the basic structure, defining an exterior surface perpendicular to said longitudinal axis to produce a magnetic field outside the magnet device in an exterior area of interest situated at a predetermined distance from said exterior surface along the longitudinal axis, the permanent magnet device being characterized in that at least one of the coaxial magnetized structures in the form of rings is divided into components in the form of non-contiguous identical sectors, and the basic structure and the set of coaxial magnetized structures in the form of rings are magnetized in the same direction to create in said exterior area of interest an induced magnetic field that is homogeneous or that has a constant gradient and that is oriented at a predetermined angle relative to said longitudinal axis.

2. A device according to claim 1, characterized in that said predetermined angle is zero and all the components in the form of sectors are magnetized along said longitudinal axis.

3. A device according to claim 2, characterized in that:
the basic structure is divided into contiguous identical sectors;
the set of coaxial magnetized structures comprises a central first structure, an intermediate structure divided into regularly distributed non-contiguous identical sectors, and an exterior structure divided into the regularly distributed non-contiguous identical sectors;
each of the coaxial magnetized structures divided into non-contiguous sectors comprises at least twelve sectors;
the coaxial magnetized structures divided into non-contiguous sectors have different thicknesses in the direction of the longitudinal axis; and
the coaxial magnetized structures divided into non-contiguous sectors are positioned at different levels along the longitudinal axis.

4. A device according to claim 3, characterized in that said non-contiguous sectors have a trapezoidal shape.

5. A device according to claim 3, characterized in that, on the side of the active exterior surface, the basic structure has a recessed central part in which there is disposed at least one coaxial magnetized structure in the form of a ring divided into components in the form of non-contiguous sectors to create in said exterior area of interest a homogeneous induced magnetic field.

6. A device according to claim 3, characterized in that the basic structure and the set of coaxial magnetized structures are produced in NdFeB or SmCo.

7. A device according to claim 1, characterized in that the basic structure is prism-shaped.

8. A device according to claim 7, characterized in that:
the basic structure is divided into contiguous identical sectors;
the set of coaxial magnetized structures comprises a central first structure, an intermediate structure divided into regularly distributed non-contiguous identical sectors, and an exterior structure divided into the regularly distributed non-contiguous identical sectors;
each of the coaxial magnetized structures divided into non-contiguous sectors comprises at least twelve sectors;
the coaxial magnetized structures divided into non-contiguous sectors have different thicknesses in the direction of the longitudinal axis; and
the coaxial magnetized structures divided into non-contiguous sectors are positioned at different levels along the longitudinal axis.

9. A device according to claim 8, characterized in that said non-contiguous sectors have a trapezoidal shape.

10. A device according to claim 8, characterized in that, on the side of the active exterior surface, the basic structure has a recessed central part in which there is disposed at least one coaxial magnetized structure in the form of a ring divided into components in the form of non-contiguous sectors to create in said exterior area of interest a homogeneous induced magnetic field.

11. A device according to claim 8, characterized in that the basic structure and the set of coaxial magnetized structures are produced in NdFeB or SmCo.

12. A device according to claim 1, characterized in that the basic structure is divided into contiguous identical sectors.

13. A device according to claim 1, characterized in that the set of coaxial magnetized structures comprises a central first structure, an intermediate structure divided into regularly distributed non-contiguous identical sectors, and an exterior structure divided into the regularly distributed non-contiguous identical sectors.

14. A device according to claim 13, characterized in that the central first structure constitutes a one-piece central block.

15. A device according to claim 14, characterized in that the one-piece central block is cylindrical with a circular section.

16. A device according to claim 14, characterized in that the one-piece central block is cylindrical with a polygonal section.

17. A device according to claim 13, characterized in that the central first structure constitutes a central block in the form of a ring divided into regularly distributed non-contiguous identical sectors.

18. A device according to claim 1, characterized in that each of the coaxial magnetized structures divided into non-contiguous sectors comprises at least twelve sectors.

19. A device according to claim 1, characterized in that the coaxial magnetized structures divided into non-contiguous sectors have different thicknesses in the direction of the longitudinal axis.

20. A device according to claim 1, characterized in that the coaxial magnetized structures divided into non-contiguous sectors are positioned at different levels along the longitudinal axis.

21. A device according to claim 1, characterized in that said non-contiguous sectors have a trapezoidal shape.

22. A device according to claim 1, characterized in that, on the side of the active exterior surface, the basic structure has a recessed central part in which there is disposed at least one coaxial magnetized structure in the form of a ring divided into components in the form of non-contiguous sectors to create in said exterior area of interest a homogeneous induced magnetic field.

23. A device according to claim 1, characterized in that the basic structure and the set of coaxial magnetized structures are produced in NdFeB or SmCo.

* * * * *